(12) United States Patent
Reyes Schuldes et al.

(10) Patent No.: US 11,923,268 B2
(45) Date of Patent: Mar. 5, 2024

(54) PRINTED HEAT SPREADER STRUCTURES AND METHODS OF PROVIDING SAME

(71) Applicant: INTEL CORPORATION, Santa Clara, CA (US)

(72) Inventors: Jesus Gerardo Reyes Schuldes, Chandler, AZ (US); Shankar Devasenathipathy, Tempe, AZ (US); Pramod Malatkar, Chandler, AZ (US); Aravindha Antoniswamy, Phoenix, AZ (US); Kyle Arrington, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 783 days.

(21) Appl. No.: 16/781,475

(22) Filed: Feb. 4, 2020

(65) Prior Publication Data
US 2021/0242105 A1    Aug. 5, 2021

(51) Int. Cl.
| | |
|---|---|
| *H01L 23/367* | (2006.01) |
| *H01L 21/48* | (2006.01) |
| *H01L 23/00* | (2006.01) |
| *H01L 23/373* | (2006.01) |
| *H05K 1/02* | (2006.01) |

(52) U.S. Cl.
CPC ...... *H01L 23/3675* (2013.01); *H01L 21/4814* (2013.01); *H01L 23/373* (2013.01); *H01L 24/16* (2013.01); *H01L 24/73* (2013.01); *H05K 1/0204* (2013.01); *H01L 2224/16* (2013.01); *H01L 2224/73253* (2013.01); *H01L 2924/1532* (2013.01)

(58) Field of Classification Search
CPC ............ H01L 23/3675; H01L 21/4814; H01L 23/373; H01L 24/16; H01L 24/73; H01L 2224/16; H01L 2224/73253; H01L 2924/1532; H01L 23/3735; H05K 1/0204
See application file for complete search history.

(56) References Cited

U.S. PATENT DOCUMENTS

| | | | | |
|---|---|---|---|---|
| 5,396,403 | A * | 3/1995 | Patel | H01L 23/433 |
| | | | | 257/713 |
| 2004/0074630 | A1* | 4/2004 | Sen | H01L 23/473 |
| | | | | 257/E23.09 |
| 2017/0042058 | A1* | 2/2017 | Pope | H01L 23/3735 |

* cited by examiner

*Primary Examiner* — Shih Tsun A Chou
(74) *Attorney, Agent, or Firm* — Essential Patents Group, LLP

(57) ABSTRACT

Techniques and mechanisms for promoting heat conduction in a packaged device using a heat spreader that is fabricated by a build-up process. In an embodiment, 3D printing of a heat spreader successively deposit layers of a thermal conductor material, where said layers variously extend each over a respective one or more IC dies. The heat spreader forms a flat top side, wherein a bottom side of the heat spreader extends over, and conforms at least partially to, different respective heights of various IC dies. In another embodiment, fabrication of a portion of the heat spreader comprises printing pore structures that contribute to a relatively low thermal conductivity of said portion. An average orientation of the oblong pores contributes to different respective thermal conduction properties for various directions of heat flow.

19 Claims, 10 Drawing Sheets

PRINTED HEAT SPREADER STRUCTURES AND METHODS OF PROVIDING SAME

BACKGROUND

1. Technical Field

This disclosure relates generally to electronics packaging and more particularly, but not exclusively, to a device assembly that includes a printed heat spreader structure.

2. Background Art

Integrated circuits (IC's) are typically assembled into packages by physically and electrically coupling them to a substrate made of organic or ceramic material. One or more IC packages can be physically and electrically coupled to a printed circuit board (PCB) to form an electronic assembly.

In the field of electronic systems there is an incessant competitive pressure among manufacturers to drive the performance of their equipment up while driving down production costs. This is particularly true regarding the packaging of IC's on substrates, where each new generation of packaging must provide increased performance, particularly in terms of an increased number of components and higher clock frequencies, while generally being smaller or more compact in size. As the density and clock frequency of IC's increase, they accordingly generate a greater amount of heat. However, the performance and reliability of IC's are known to diminish as the temperature to which they are subjected increases, so it becomes increasingly important to adequately dissipate heat from IC environments, including IC packages.

An IC substrate typically comprises a number of metal layers selectively patterned to provide metal interconnect lines (referred to herein as "traces"), which facilitate coupling with one or more electronic components mounted on one or more surfaces of the substrate. The electronic component or components are functionally connected to other elements of an electronic system through a hierarchy of electrically conductive paths that include the substrate traces. The substrate traces typically carry signals that are transmitted between the electronic components, such as IC's, of the system. Some IC's have a relatively large number of input/output (I/O) terminals (also called "lands"), as well as a large number of power and ground terminals or lands.

As the internal circuitry of IC's, such as processors, operates at higher and higher clock frequencies, and as IC's operate at higher and higher power levels, the amount of heat generated by such IC's can increase their operating temperature to unacceptable levels.

For the reasons stated above, and for other reasons stated below which will become apparent to those skilled in the art upon reading and understanding the present specification, there is a significant need in the art for apparatus and methods for packaging an IC on a substrate that minimize heat dissipation problems associated with high clock frequencies and high power densities.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
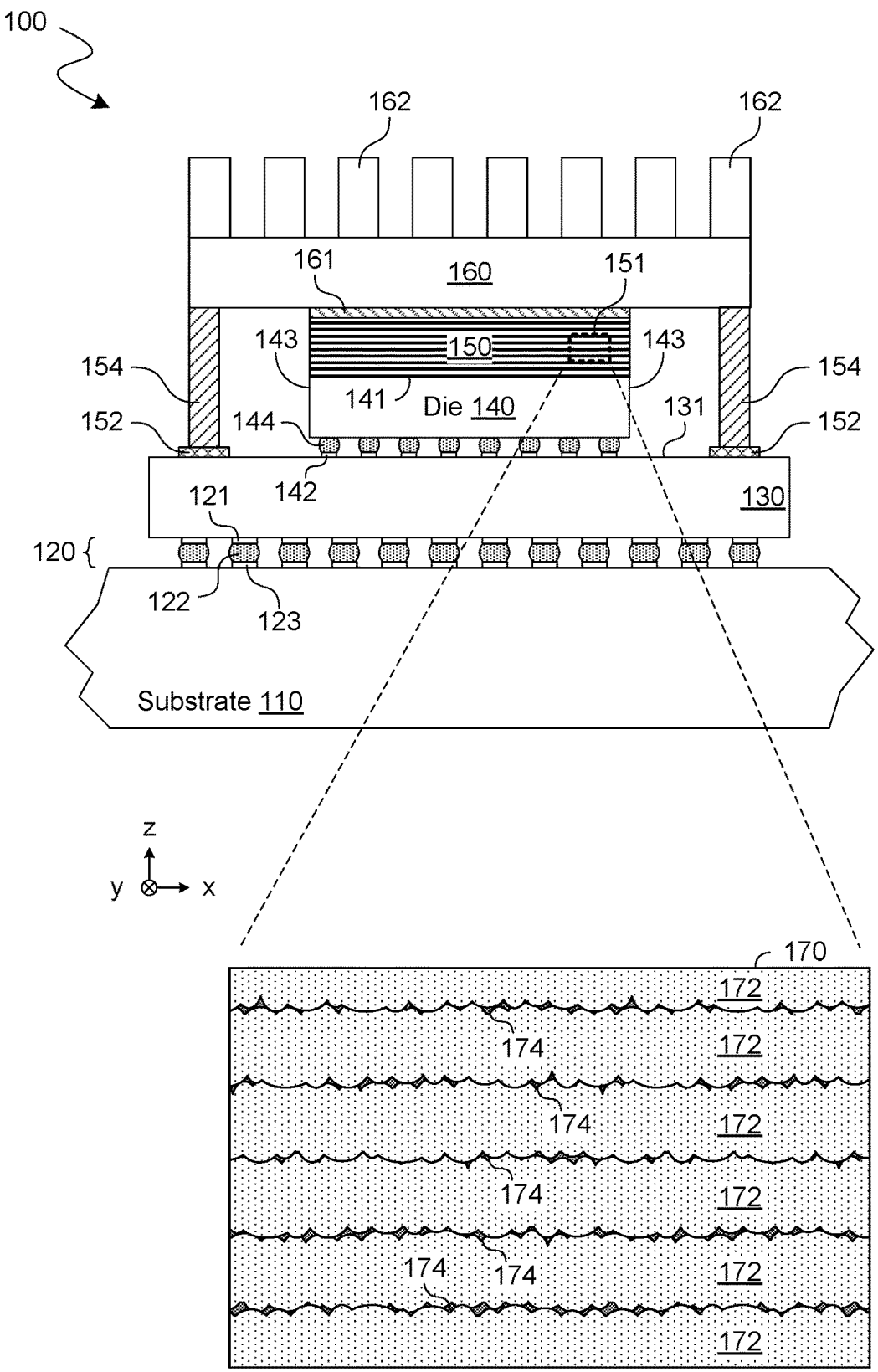
FIG. 1 illustrates a cross-sectional side view diagram showing features of a device assembly comprising a heat spreader according to an embodiment.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

It is pointed out that those elements of the figures having the same reference numbers (or names) as the elements of any other figure can operate or function in any manner similar to that described, but are not limited to such.

Embodiments described herein variously provide techniques and mechanisms for improving heat conduction in a packaged device with a heat spreader which is fabricated by build-up processing. For example, in some embodiments, three-dimensional (3D) printing is performed to successively deposit layers of a thermal conductor material such as copper, silver, aluminum or other suitable metal or composites with a high thermal conductivity such as a silver-diamond or copper-diamond. This successive deposition takes place over one or more integrated circuit (IC) dies or—alternatively—prior to a movement of the completed heat spreader into a position of alignment with the one or more IC dies. In one such embodiments, portions of a printed heat spreader have various thicknesses to provide a flat top side, whereas a bottom side of the heat spreader conforms at least partially to IC dies of different respective heights over an interposer or other substrate.

In various embodiments, at least a portion of a heat spreader forms pore structures (for brevity, also referred to herein simply as "pores") that contribute to a relatively low thermal conductivity of said portion—e.g., as compared to the thermal conductivity of another portion of the heat spreader. In one such embodiment, pores in a given portion of a heat spreader are substantially oblong in shape. In this particular context of pore shape, "oblong" refers herein to the characteristic of a pore having a maximum overall span which is at least 15% longer than another maximum span of the pore in a direction which is orthogonal to a line of direction of the maximum overall span. For a given portion of a heat spreader, the pores of the portion are "substantially oblong" where 50% or more of the pores in said region are each oblong in shape.

With respect to a given one oblong pore, said pore has an "orientation" (as referred to herein) which is a line of direction of that pore's maximum overall span. Where pores of a given portion are substantially oblong, said pores are variously referred to herein as having an "average orientation" which is an average of the respective orientations of the individual oblong pores. For oblong pores in a given portion of a heat spreader, an average orientation of said pores is described herein as being "substantially orthogonal"

to a particular line where an angle between the average orientation and the particular line is at least forty-five degrees (45°).

FIG. 1 shows features of a device assembly 100 to conduct heat with integrated circuitry according to an embodiment. Device assembly 100 is one example of an embodiment wherein a heat spreader structure, which comprises a material stack or other such artifacts of a build-up process, is thermally coupled to conduct heat with one or more integrated circuit (IC) dies.

As shown in FIG. 1, device assembly 100 includes an integrated heat spreader IHS 150, in accordance with one embodiment, and an IC die 140 which is thermally coupled thereto. In the example embodiment shown, IC die 140 is mounted in a "flip-chip" orientation wherein signal conductors (not shown) of IC die 140 terminate in electrical contacts or lands (not shown) on a bottom surface of IC die 140. These lands are configured to be coupled to corresponding electrical contacts—such as the illustrative lands 142 representing signal, power, or ground nodes on the upper surface 131 of interposer 130—by appropriate connections such as C4 solder bumps 144. A suitable underfill (not shown), such as an epoxy material, is disposed around C4 solder bumps 144 to provide mechanical stability and strength. Interposer 130 includes any of various one-layer substrates or multi-layer substrates—e.g., including an organic land grid array (OLGA) substrate, a glass substrate, or a ceramic substrate.

Although some embodiments are not limited in this regard, IHS 150 is further thermally coupled to one or more other structures—such as the illustrative heat sink 160 and heat fins 162 shown—to facilitate heat conduction via IHS 150. Respective surface areas of heat sink 160 and heat fins 162 facilitate dissipation of heat into the ambient environment. Alternatively or in addition, device assembly 100 further comprises (or is configured to couple to) an additional substrate 110—such as a printed circuit board (PCB) or card—on which interposer 130 is mounted. For example, lands 121 of interposer 130 are mechanically and electrically coupled to corresponding lands 123 of substrate 110 by suitable connectors such as ball grid array (BGA) solder balls 122.

In the example embodiment shown, distortion of interposer 130 is mitigated with a stiffener 154 which is coupled to the upper surface 131 of interposer 130 through a suitable sealant 152—e.g., where stiffener 154 is located at a periphery of interposer 130. Sealant 152 can comprise a thermally conductive material such as a thermal grease or gel, or a heat-curable material such as a thermo-setting resin or epoxy. The thermally conductive material can comprise particles of metal or other thermally conductive substance(s).

While a hardware interface 120—comprising lands 121, lands 123 and BGA solder balls 122—is illustrated in FIG. 1 for coupling interposer 130 to substrate 110, some embodiments are not limited to use with a BGA arrangement, and any of various other types of packaging technology are possible. Further, some embodiments are not to be construed as limited to use in C4 packages, and it can be used with any other type of IC package where the herein-described features of the present invention provide an advantage. Furthermore, various embodiments omit some or all of substrate 110, hardware interface 120, interposer 130, sealant 152, stiffener 154, heat sink 160, and heat fins 162.

In some embodiments, IC die 140 provides functionality of one or more memories, processors, controllers and/or any of various other integrated circuits—e.g., wherein IC die 140 includes a system-on-chip. However, some embodiments are not limited to a particular functionality that is provided by IC die 140, or a particular technology by which IC die 140 is mounted on interposer 130. Operation of IC die 140 results in a generation of heat from wiring traces and/or other internal structures. IC die 140 is thermally coupled to enable at least some of such heat to dissipate through a top surface 141 of IC die 140 and, directly or indirectly, into IHS 150. IHS 150 comprises a stack of multiple layers including any of various suitable heat conductive materials—e.g., including copper, aluminum, and/or other such metals (or alloys thereof)—which accommodate sequential deposition in particulate form to fabricate layers. In one such embodiment, a material of IHS 150 has a thermal conductivity of at least 100 Watts per meter per degree Kelvin ($W \cdot m^{-1} \cdot °K^{-1}$).

For example, FIG. 1 further includes a cross-sectional detail view 170 illustrating structures such as those in a region 151 of IHS 150. As shown in detail view 170, IHS 150 comprises a stack of successive material layers 172 that extend horizontally in an x-y plane of the xyz coordinate system shown. Some or all of layers 172 are each in direct contact with respective one or more others of layers 172. For example, a first layer is a closest one of layers 172 to surface 141, and a second layer of layers 172 is in direct contact with a second one of material layers 172—e.g., wherein the first and second layers each have substantially the same composition. By way of illustration and not limitation, said first layer and second layer each comprise predominantly copper or an alloy thereof, or predominantly aluminum or an alloy thereof. In another embodiment, various ones of layers 172 have respective compositions which are substantially different from each other.

As a result of build-up processing to fabricate IHS 150, boundaries 174 are variously formed each by a respective adjoining two of layers 172. In various embodiments, an artifact of 3D printing at IHS 150 includes at least a portion of a given one of layers 172—e.g., at least a surface at one of boundaries 174—having a residual structure of granules that have been melted, sintered or otherwise bonded to one another. In some embodiments, a given one of layers 172 includes a residue of granules which, along a vertical (z-axis) line of direction, exhibit a variation in average grain size from a middle of the layer to an edge of the layer.

In an example embodiment, an average overall thickness (z-axis dimension) of IHS 150 is, for example, in a range of 100 microns (m) to 5 millimeters (mm)—e.g., in a range of 150 m to 4 mm and, in some embodiments, in a range of 200 m to 3 mm. In one such embodiment, an average thickness (z-axis dimension) of a given one of layers 172 is in a range of 20 m to 80 m—e.g., in a range of 20 m to 50 m. However, some embodiments are not limited with respect to a particular thickness of IHS 150, a particular thickness of a given one of layers 172.

The IHS 150 is formed in either of at least two different ways, in various embodiments. For example, IHS 150 is formed by a build-up process, such as 3D printing, which successively deposits a stack of multiple layers of one or more thermal conductive materials on surface 141 of IC die 140 (opposite the side by which IC die 140 is coupled to interposer 130). Alternatively, IHS 150 is formed apart from IC die 140 (by a build-up process on a surface other than surface 141), wherein the completely formed IHS 150 is subsequently moved into position—e.g., via a pick-and-place process—for bonding with IC chip 140.

In the example shown, IHS 150 is deposited directly on surface 141—e.g., wherein a closest material layer of IHS 150 is in direct contact (for example) with a semiconductor substrate structure at a front end-of-line of IC die 140. In alternative embodiments, one or more other material layers (not shown) are disposed between surface 141 and a bottom side of IHS 150 which is opposite surface 141. By way of illustration and not limitation, said one or more other material layers includes a thermal interface material (TIM) that fills in surface irregularities and gaps at surface 141 to promote heat transfer between surface 141 and IHS 150. In one such embodiment, a TIM (adapted, for example, from conventional techniques) includes any of various fluids—such as a silicone, grease or other fluid—in which are disposed particles of a polymeric, ceramic, or other suitable filler to promote thermal conductivity. Any of various solders are also suitable to function as a TIM, in some embodiments. Such a solder includes, for example, indium (In), gold (Au), tin (Sn), lead (Pb) or any of various alloys thereof—e.g., wherein the TIM is an indium solder, a AuSn solder, a InPb solder, or a SnPb solder. For example, a TIM 161 which is deposited on IHS 150 to facilitate thermal conductivity between IHS 150 and heat sink 160 is to be distinguished (in some embodiments) from an absence of any such TIM between IC die 140 and IHS 150.

Alternatively or in addition, one or more other material layers disposed between surface 141 and IHS 150 include a surface treatment material such as a layer of a metallization which is different from any of IHS 150. For example, said metallization layer—e.g., including nickel, vanadium, titanium, gold—promotes adhesion of IHS 150 to surface 141 and/or mitigates diffusion of material from IHS 150 into a semiconductor of IC die 140. In some embodiments, any material between surface 141 and IHS 150 is one other than that of a mold compound (not shown) that extends around at least part of IC die 140 and/or interposer 130.

The IHS 150 extends horizontally over at least part of surface 141—e.g., wherein IHS 150 extends to some or all of sidewall structures 143 formed by IC die 140. IC die 140 is thus able to dissipate a substantial amount of heat at least vertically through IHS 150. In various embodiments, IHS 150 further extends horizontally, past some or all sidewall structures 143, to rest on or otherwise adjoin stiffener 154 and/or any of various other structures mounted on interposer 130.

In some embodiments, a bottom side of IHS 150 resides entirely within one horizontal layer. In other embodiments, the bottom side of IHS 150 includes portions which variously extend in different respective horizontal layers—e.g., wherein the bottom side comprises flat portions at different respective heights along the z-dimension shown. For example, one such bottom portion of IHS 150 extends horizontally over IC die 140, where another bottom portion of IHS 150 extends horizontally over another IC die (not shown) that is also mounted on interposer 130.

In some embodiments, at least a portion of IHS 150 has pores (not shown) formed therein—e.g., wherein said pores mitigate thermal conductivity between two other portions of IHS 150. For example, some or all such pores have therein air (or other such gas) or, alternatively, a vacuum. In some embodiments, some or all pores have disposed therein an epoxy, polymeric resin or other suitable material which, as compared to copper or another metal of layers 172, has relatively low thermal conductivity. In one example embodiment, a pore volume fraction of one such portion of IHS 150 (i.e., a ratio of a volume of pores of the portion to the overall volume of the portion) is at least 1%. For example, said pore volume fraction is 2% or more—e.g., wherein the pore volume fraction is 5% or more and, in some embodiments, 10% or more.

Figure 2:
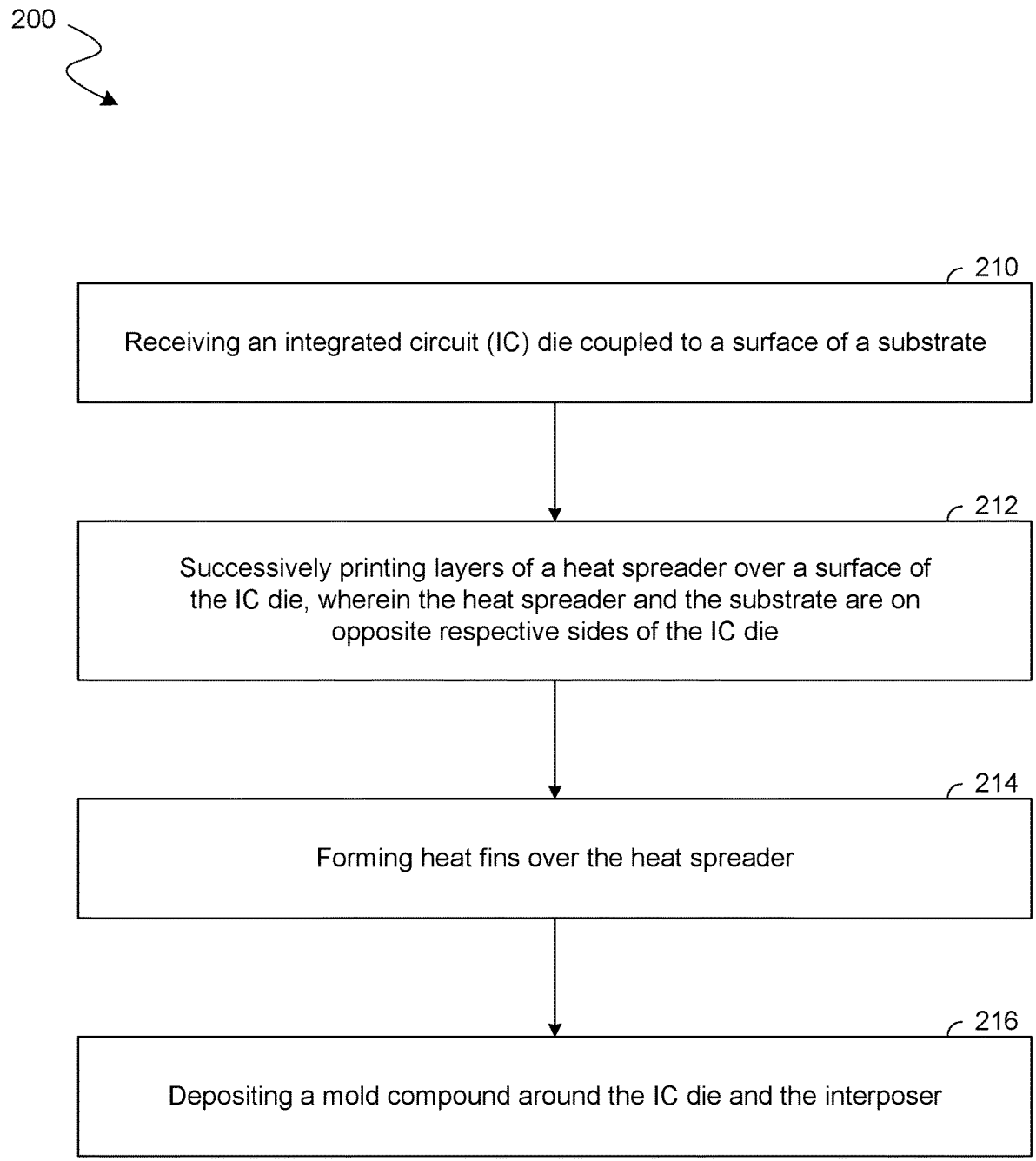
FIG. 2 illustrates a flow diagram showing features of a method to provide heat spreader structures according to an embodiment.

FIG. 2 shows features of a method 200 to provide structures of a heat spreader according to an embodiment. Method 200 is one example of an embodiment wherein build-up processing (e.g., three-dimensional printing) is performed to fabricate some or all of an integrated heat spreader. In various embodiments, method 200 provides structures such as those of IHS 150, for example.

To illustrate certain features of various embodiments, method 200 is described herein with reference to various stages 300-305—shown in FIGS. 3A-3F (respectively)—of fabrication processing to provide heat spreader structures according to an embodiment. Stages 300-305 illustrate one example of an embodiment wherein three-dimensional printing is performed to fabricate, for example, an integrated heat spreader of a packaged circuit device. It is to be appreciated that, in various embodiments, method 200 is performed to provide structures in addition to, or other than, those shown in FIGS. 3A-3F.

As shown in FIG. 2, method 200 includes (at 210) receiving an IC die coupled to a surface of a substrate—e.g., wherein said receiving includes bonding IC chip 140 to surface 131 of interposer 130. In some embodiments, the receiving at 210 further comprises coupling interposer 130 to IC die 140 via hardware interface 120—e.g., wherein said coupling includes operations adapted from any of various conventional techniques to interconnect integrated circuitry.

For example, referring now to the example embodiment illustrated by FIGS. 3A-3F, at stage 300, one or more IC dies—e.g., including the illustrative IC dies 340, 370 shown—are mounted on an interposer 330. A hardware interface 342 comprises a ball grid array, or any of various other suitable interconnect structures, by which IC die 340 is electrically coupled to a surface 331 of interposer 330. Similarly, another hardware interface 372 electrically couples IC die 370 to another region of surface 331. In an embodiment, electrical coupling of IC dies 340, 370 to surface 331 includes one or more operations adapted from conventional circuit assembly and packaging techniques.

Subsequently, at stage 301, preparation for printing a stack of material layers of a heat spreader includes a deposition 381 to form a thermal insulator 380 that is to mitigate heat conduction between IC dies 340, 370. In one such embodiment, deposition 381 includes an injection molding or other suitable processing to provide, on select portions of surface 331, a mold compound which has a low thermal conductivity. For example, deposition 381 takes place through a hole in a patterned mask 332 which (for example) some or all of respective top surfaces 341, 371 of IC dies 340, 370. A subsequent removal of patterned mask 332 exposes, or otherwise makes accessible, surface 341 and/or surface 371 for thermal coupling with structures of a printed heat spreader. Although some embodiments are not limited in this regard, insulator 380 extends vertically at least to a height of surface 341, for example.

Referring again to FIG. 2, method 200 further comprises (at 212) successively printing layers of a heat spreader structure over a surface of the IC die, wherein the heat spreader structure and the substrate are on opposite respective sides of the IC die. For example, the layers—e.g., comprising a metal such as copper or aluminum—are successively printed in a region over the first IC die. In a method according to another embodiment, layers of a heat spreader are successively printed at some other location prior to a pick-and-place (or other suitable operation) which moves the printed heat spreader into position for an adhering or other bonding which thermally couples the heat spreader over the IC die. After the printing at 212, the IC die extends between the heat spreader and the substrate.

Figure 3A:
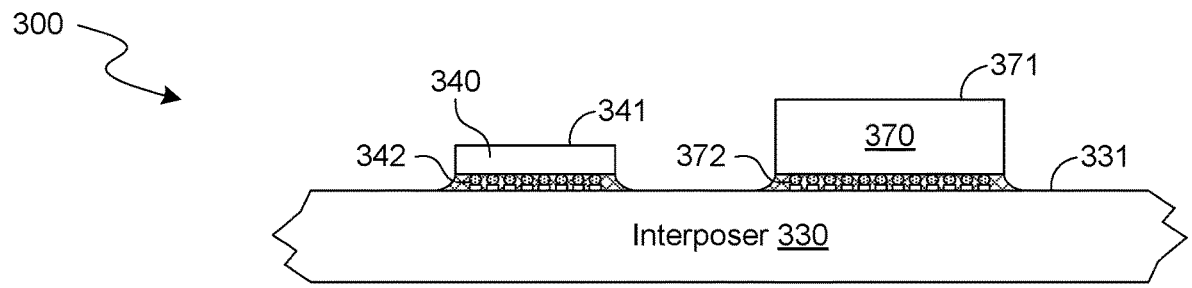
FIGS. 3A-3F illustrate cross-sectional side view diagrams each of a respective stage of processing to fabricate a heat spreader according to an embodiment.
Figure 3B:
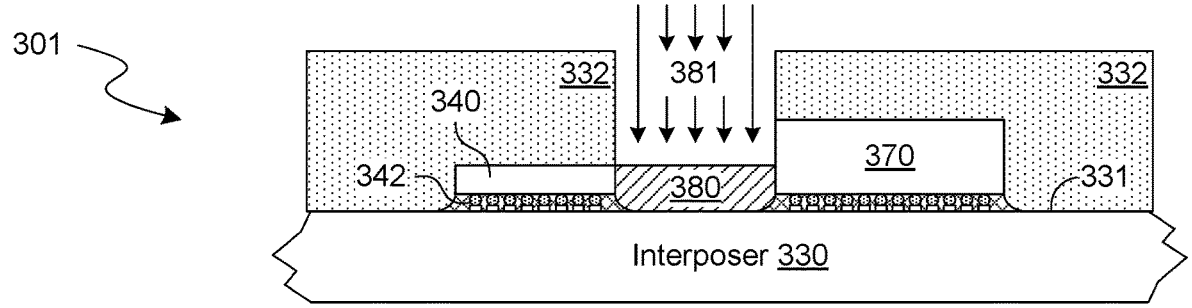
Figure 3C:
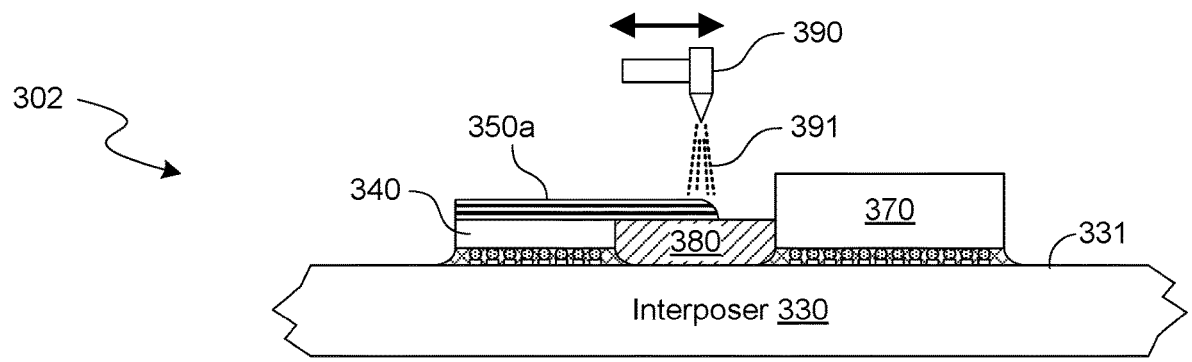
Figure 3D:
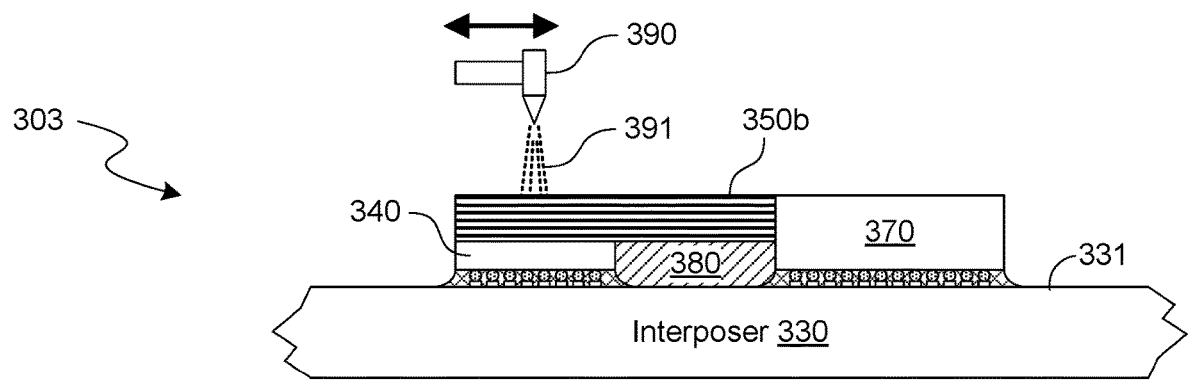
Figure 3E:
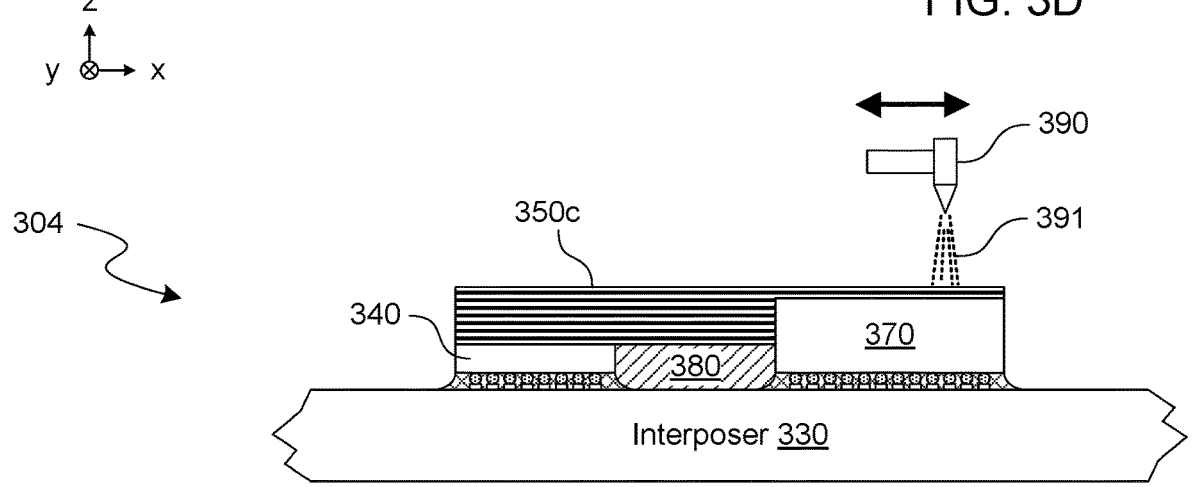

For example, as illustrated in FIG. 3C by stage 302, build-up processing according to some embodiments includes depositing a thermally conductive material layers 350a (e.g., including copper, aluminum or other suitable metal) with a spray 391 from a nozzle 390 of a 3D printer. The deposited material layers 350a are formed, for example, as a rate of spray 391 is selectively controlled and/or as nozzle 390 is selectively moved over a region which includes surface 341 and a top surface of insulator 380. Such printing continues until, as shown at stage 303, deposited material layers 350b extend from surface 341, and from a top surface of insulator 380, to a height of surface 371. Subsequently, as shown at stage 304, a range of horizontal movement by nozzle 390 is extended for the printing of additional layers. This increased range contributes to deposited material layers 350c further extending to a region over surface 371.

Referring again to FIG. 2, in various embodiments, the heat spreader adjoins a semiconductor substrate portion of the IC die. In an alternative embodiment, method 200 further comprises depositing one or more other material layers on the IC die (e.g., including a surface treatment material or a TIM), wherein after the printing at 212, the IC die and the heat spreader each adjoin a respective one of the one or more other material layers.

In some embodiments, other operations (not shown) of method 200 comprise, for example, mounting another IC die—e.g., IC die 370—on the surface of the substrate. After the printing at 212, a first portion of the heat spreader extends over the IC die which is received at 210, and a second portion of the heat spreader extends over the other IC die. In one such embodiment, a first average (z-dimension) thickness of the first portion is greater than a second average (z-dimension) thickness of the second portion—e.g., greater by at least 10% of the second average thickness. Additionally or alternatively, after the printing at 212, a third portion of the heat spreader extends over a region between the IC die which is received at 210 and the other IC die.

Figure 3F:
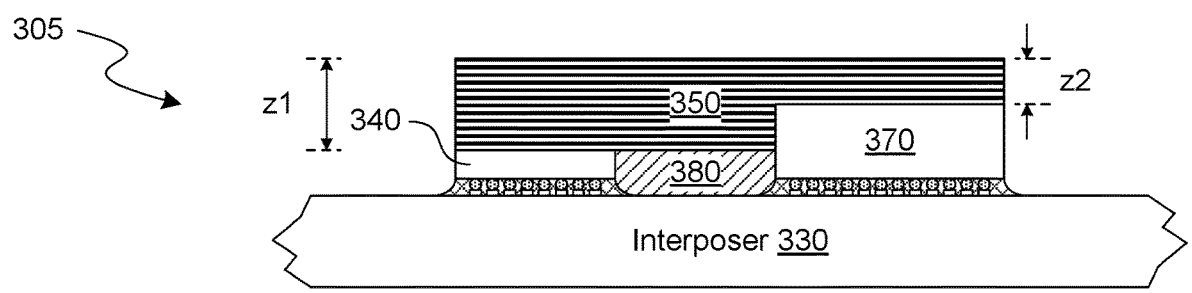

For example, as illustrated in FIG. 3F by stage 305, a heat spreader 350 (which is formed by the 3D printing during stages 302-304) includes portions which variously extend over different respective IC dies—e.g., where two or more such IC dies each have a different respective maximum height over surface 331. In the example embodiment shown, a first portion of heat spreader 350 which extends over surface 341 of IC die 340 has a thickness z1, whereas a second portion of heat spreader 350 which extends over surface 371 of IC die 370 has a different thickness z2. A third portion of heat spreader 350 extends over the insulator 380 which is disposed between IC dies 340, 370. In an embodiment, those material layers of heat spreader 350 which contribute to the thickness z1 have a first total number which is different than a second total number of material layers which contribute to the thickness z2.

Referring again to FIG. 2, in some embodiments, the printing at 212 comprises (or is otherwise based on) 3D printing to form pores of at least a first portion of the heat spreader—e.g., wherein a gas or a vacuum is in said pores. In one such embodiment, pores of the heat spreader are formed at least in part with a first material of the printed layers, wherein a second material, disposed in the pores, has a relatively low thermal conductivity, as compared to the first material. In some embodiments, a heat spreader comprises a first portion and a second portion, wherein a first pore volume fraction of the first portion is greater than a second pore volume fraction of the second portion.

Although some embodiments are not limited in this regard, method 200 includes one or more additional operations—e.g., adapted from existing device packaging technique—to protect integrated circuitry from (and/or facilitate heat dissipation to) an ambient environment. For example, method 200 further comprises (at 214) forming heat fins—directly or indirectly—over the heat spreader, and (at 216) depositing a mold compound around the IC die and the interposer. The forming at 214 and depositing at 216 (which are optional in some embodiments) are adapted, for example, from conventional semiconductor packaging techniques.

Figure 4A:
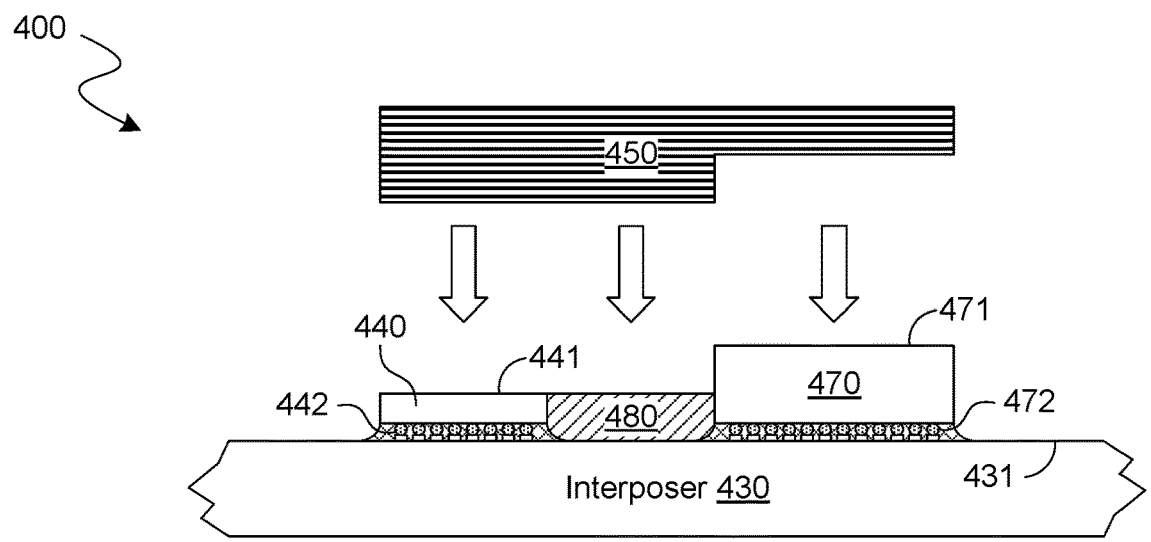
FIGS. 4A, 4B illustrate cross-sectional side view diagrams each of a respective stage of processing to assemble circuitry with a heat spreader according to an embodiment.
Figure 4B:
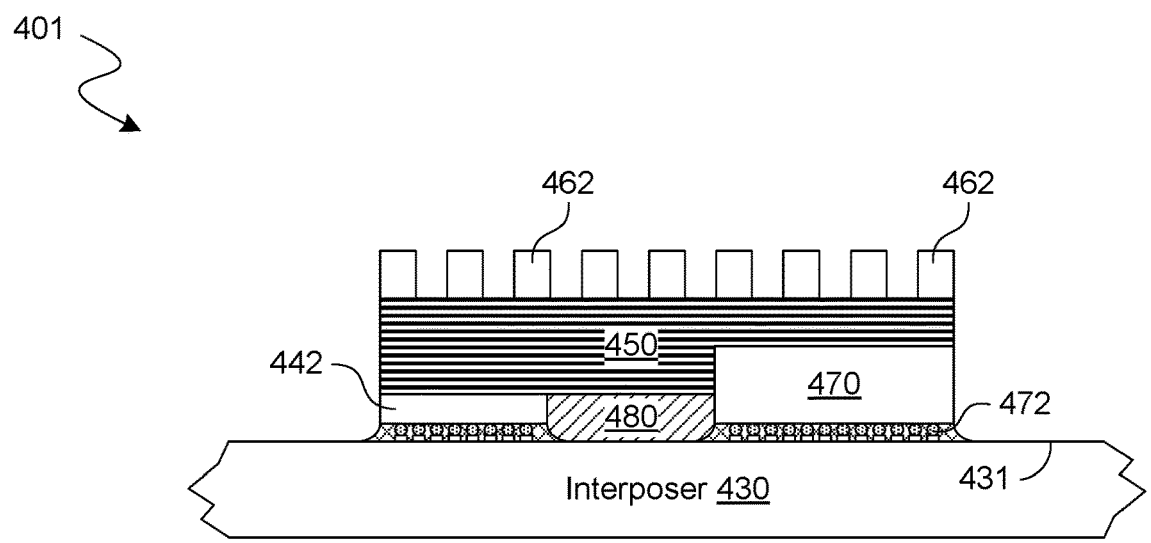

FIGS. 4A, 4B show respective stages 400, 401 of assembly processing to thermally couple integrated circuitry with a heat spreader according to another embodiment. Stages 400, 401 illustrate one example of an alternative embodiment wherein the manufacture of a device assembly includes a pick-and-place operation to couple a printed heat spreader to one or more IC dies. Assembly processing such as that illustrated by stages 400, 401 includes features of method 200, for example.

As illustrated by stage 400 in FIG. 4A, multiple IC dies (such as the illustrative IC dies 440, 470 shown) are mounted on an interposer 430—e.g., wherein respective hardware interfaces 442, 472 variously couple IC dies 440, 470 each to a top surface 431 of interposer 430. An insulator 480 is also formed on surface 431 to mitigate thermal conduction between IC dies 440, 470—e.g., wherein insulator 480 extends at least partially toward a maximum (z-dimension) height of surface 441. In one such embodiment, interposer 430, hardware interfaces 442, 472, insulator 480 and IC dies 440, 470 correspond functionally to interposer 330, hardware interface 342, 372, insulator 480 and IC dies 340, 370 (respectively).

At stage 400, a heat spreader 450—which was previously printed at another location (not shown)—is moved into position over surface 441, insulator 480 and surface 471. Heat spreader 450 is then bonded to IC dies 440, 470 and to insulator 480—e.g., with a thermal adhesive or other suitable material adapted, for example, from conventional integrated circuit assembly techniques. As shown at stage 401 in FIG. 4B, heat fins 462 are subsequently formed directly or indirectly on heat spreader 450.

Figure 5A:
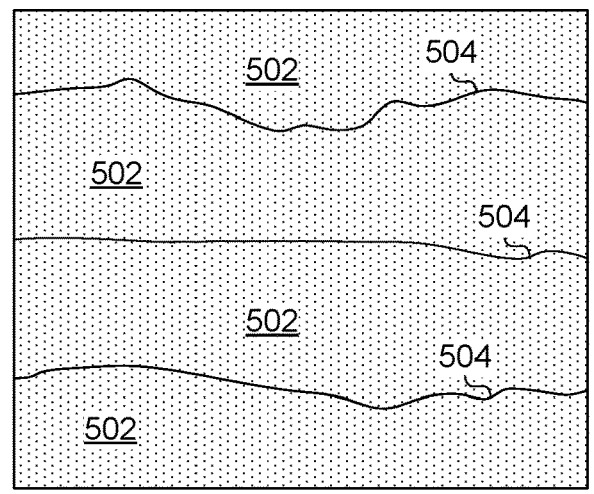
FIGS. 5A, 5B illustrate cross-sectional detail views each of a respective heat spreader according to a corresponding embodiment.
Figure 5B:
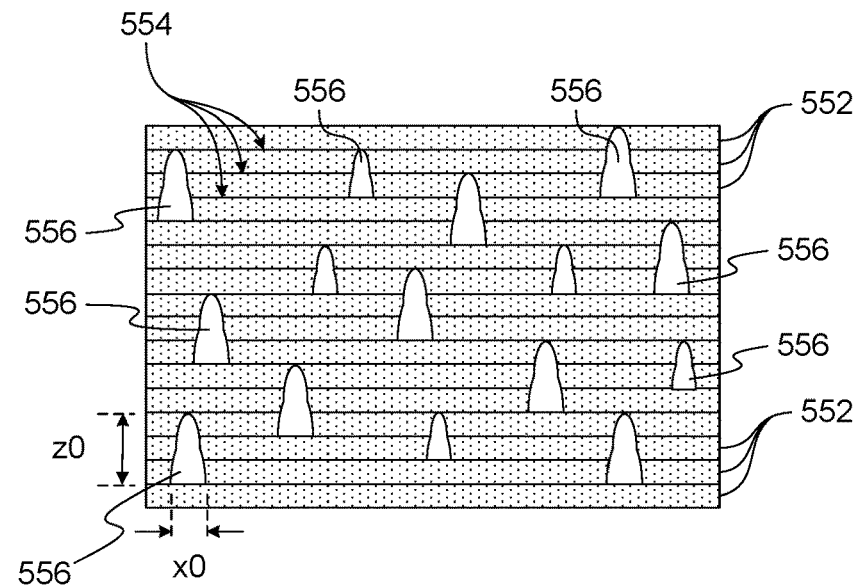

Referring now to FIGS. 5A, 5B, respective detail views of heat spreaders 500, 550 are variously shown, each according to a corresponding embodiment. Heat spreaders 500, 550 variously includes one or more features each of a respective one of IHS 150, heat spreader 350, or heat spreader 450, for example. In some embodiments, structures of one of heat spreaders 500, 550 are provided according to method 200.

As shown in FIG. 5A, heat spreader 500 comprises a stack of successively printed material layers 502 of a thermally conductive material. Layers 502 variously extend horizontally in an x-y plane of the xyz coordinate system shown, wherein grain boundaries 504 are variously formed each by a respective adjoining two of layers 502. In various embodiments, 3D printing to form heat spreader 500 results in an artifact of at least some grains, in a given one of layers 502, being partially recrystallized or amorphous. Such recrystallized or amorphous properties are a result, for example, of a rate of cooling after layered deposition of a copper, aluminum, or other suitable metal of layers 502.

As shown in FIG. 5B, heat spreader 550 comprises a stack of successively printed material layers 552 of a thermally conductive material, wherein substantially horizontal grain boundaries 554 are variously formed each by a respective adjoining two of layers 552. In various embodiments, 3D printing to fabricate heat spreader 550 includes performing a patterned print to form pores (e.g., including the illustrative pores 556 shown) in layers 552. Some or all of pores 556 are variously defined each by at least a respective two of material layers 552. In some embodiments, a first one of layers 552 defines one of a top, a bottom, or a sidewall structure of a given one of pores 556, where an adjoining second one of layers 552 defines another one of the top, the bottom, or the sidewall structure of that same one of pores 556. In one such embodiment, for some or all of pores 556, each such pore has a vertical height which, for example, is equal to a height of a respective multiple ones of layers 552.

In some embodiments, a porosity $\phi_1$ (for example, a pore volume fraction) of a first portion of heat spreader 550 is at least 1%—e.g., wherein porosity $\phi_1$ is 2% or more and, in some embodiments, 5% or more. For example, porosity $\phi_1$ is in a range of 3% to 20% (e.g., in a range of 5% to 15%). Additionally or alternatively, a second portion of heat spreader 550 has a second porosity $\phi_2$ which is less than the porosity $\phi_1$. For example, some or all of said second portion is disposed vertically over a first IC die, wherein porosity $\phi_1$ of the first portion mitigates heat transfer between the second portion and a third portion of the heat spreader 550 which extends over a second IC die. In one such embodiment, a ratio $r_{21}$, equal to $(\phi_2/\phi_1)$ is less than or equal to 0.9—e.g., where the ratio $r_{21}$ is less than or equal to 0.75 and, in some embodiments, less than or equal to 0.65.

In some embodiments, some or all pores in at least a portion of heat spreader 550 are substantially oblong. For example, in FIG. 5B, one such oblong pore has a maximum width x0 and a maximum height z0 which is at least 15% more than maximum width x0. In various embodiments, some or all oblong pores in said portion each have a respective orientation that is substantially orthogonal to a line (e.g., along the x-axis variously shown in FIGS. 3A, 3B and 4) which includes a shortest distance between two IC dies. For example, an orientation of some or all such oblong pores is substantially vertical, in some embodiments.

Figure 6A:
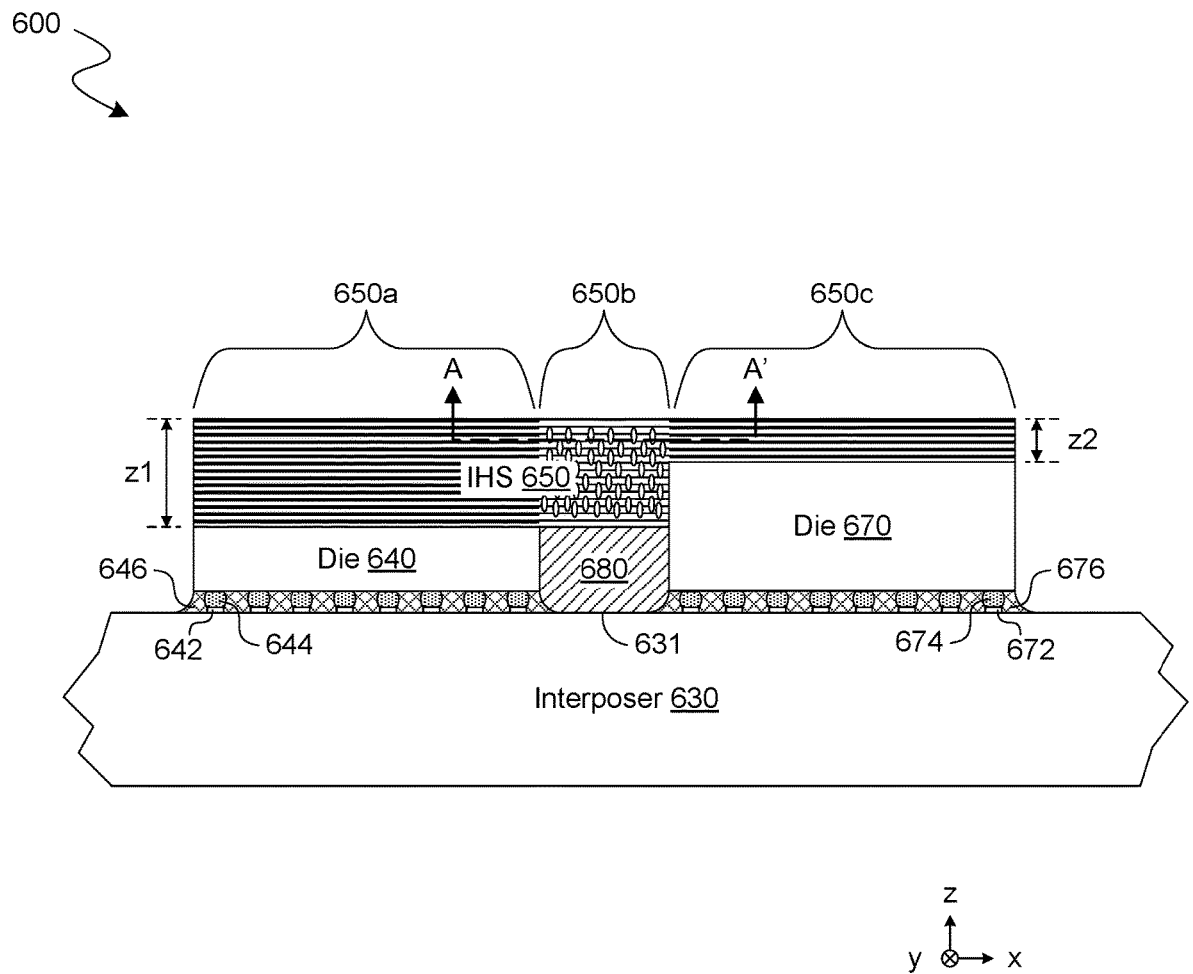
FIGS. 6A, 6B illustrate cross-sectional view diagrams each showing respective features of a device assembly comprising a printed heat spreader according to an embodiment.
Figure 6B:
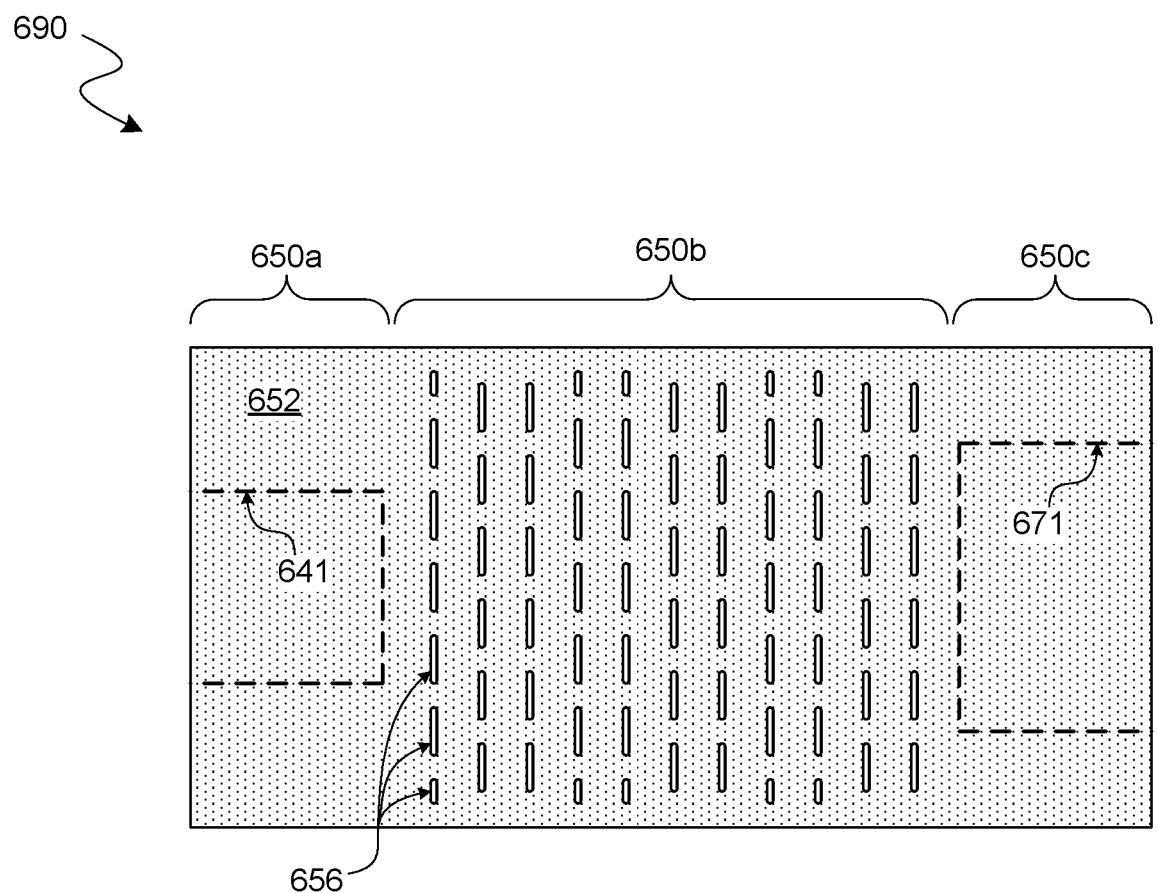

FIGS. 6A, 6B variously show features of a device assembly 600 to conduct heat multiple IC dies according to an embodiment. Device assembly 600 is one example of an embodiment wherein a porosity of at least one portion of a heat spreader mitigates heat transfer between two IC dies. In various embodiments, device assembly 600 includes one or more features of device assembly 100.

As shown in FIG. 6A, device assembly 600 includes an interposer 630 and multiple IC dies mounted thereon. For example, electrical contacts or lands (not shown) on a bottom surface of an IC die 640 coupled to corresponding lands 642 which are to provide any of various signals, power, or grounds via an upper surface 631 of interposer 630—by appropriate connections such as C4 solder bumps 644. A suitable underfill 646, such as an epoxy material, is disposed around C4 solder bumps 644 to provide mechanical stability and strength. Similarly, other lands (not shown) on a bottom surface of an IC die 670 are coupled, via other C4 solder bumps 674, to corresponding lands 672 which are also at surface 631—e.g., wherein an underfill 676 is disposed between IC die 670 and interposer 630. An insulator 680 (a mold compound, for example) is also located on surface 631 to mitigate thermal conduction between IC dies 640, 670. In one such embodiment, interposer 630, hardware interfaces 642, 672, insulator 680 and IC dies 640, 670 correspond functionally to interposer 430, hardware interface 442, 472, insulator 480 and IC dies 440, 470 (respectively).

The illustrative device assembly 600 further comprises a heat spreader 650 according to one embodiment—e.g., wherein heat spreader 650 includes features of one of heat spreaders 150, 350, 450, 500, 550. Heat spreader 650 includes successive layers of one or more heat conductive materials—e.g., wherein said layers include any of various indicia, as described herein, of a build-up process such as 3D printing.

In the example embodiment shown, heat spreader 650 comprises a portion 650a which extends over IC die 640, a portion 650c which extends over IC die 670, and a portion 650b (disposed between portions 650a, 650c) which extends over insulator 680. As compared to one or both of portions 650a, 650c, portion 650b has a relatively low thermal conductivity to mitigate heat transfer between IC dies 640, 670 via a heat spreader 650. For example, printed layer structures of portion 650b form pores that have therein a vacuum or a material which is a relatively poor thermal conductor. In an embodiment, first pores, which are respective closest neighboring pores to each other in portion 650b, are at a first spacing which is smaller than a second spacing of second pores (if any) that are respective closest neighboring pores to each other in portion 650a.

In some embodiments, pores formed in portion 650b are substantially oblong—e.g., wherein some or all said oblong pores each has a respective orientation which is orthogonal to a line of direction (such as the x-axis of the xyz coordinate system shown) which extends through opposing sides of IC dies 640, 670. In the example embodiment shown, oblique pores of portion 650b are substantially oriented vertically (along the z-axis shown). Additionally or alternatively, heat spreader 650 is shaped to provide a relatively flat top side, despite differences between the respective heights of one or more IC dies that extend under the bottom side of heat spreader 650. For example, portion 650a, 650c each have a thickness z1, whereas portion 650b has a thickness z2 (e.g., wherein z1 is at least 10% larger than z2). In an embodiment, a first total number of material layers of portion 650a (or of portion 650b) is different than a second total number of material layers of portion 650c.

Referring now to FIG. 6B, view 690 illustrates a horizontal (x-y plane) cross-section of device assembly 600—e.g., wherein view 690 corresponds to the line A-A' shown in FIG. 6A. View 690 shows a cross-section in one material layer 652 of heat spreader 650, wherein the dashed line 641 represents an area where layer 652 overlaps IC die 640, and the dashed line 671 represents an area where layer 652 overlaps IC die 670.

Portion 650b includes a region of layer 652 which defines at least in part pores (such as the illustrative pores 656 shown) to mitigate heat transfer between IC die 640 and IC die 670. For example, layer 652 forms at least in part respective sidewall structures of pores 656—e.g., where one or more layers of heat spreader 650 which are under layer 652 variously define respective bottoms of pores 656, and/or where one or more layers of heat spreader 650 which are over layer 652 variously define respective tops of pores 656.

Some or all of the illustrative pores 656 shown in view 690 each have a respective orientation which, for example, is substantially orthogonal to a line of shortest distance between IC die 640 and IC die 670. In the illustrative embodiment shown, the pores 656 in view 690 each have a respective longest dimension along the y-axis. Some or all such pores 656, in some embodiments, each have a respective second longest dimension along the z-axis, for example. For a given two pores in portion 650b (where one such pore is a respective closest pore to the other such pore), said pores are at a respective first spacing from one another—e.g., wherein said first spacing is less than a spacing of two pores (if any) in one of portions 650a, 650c.

Figure 7:
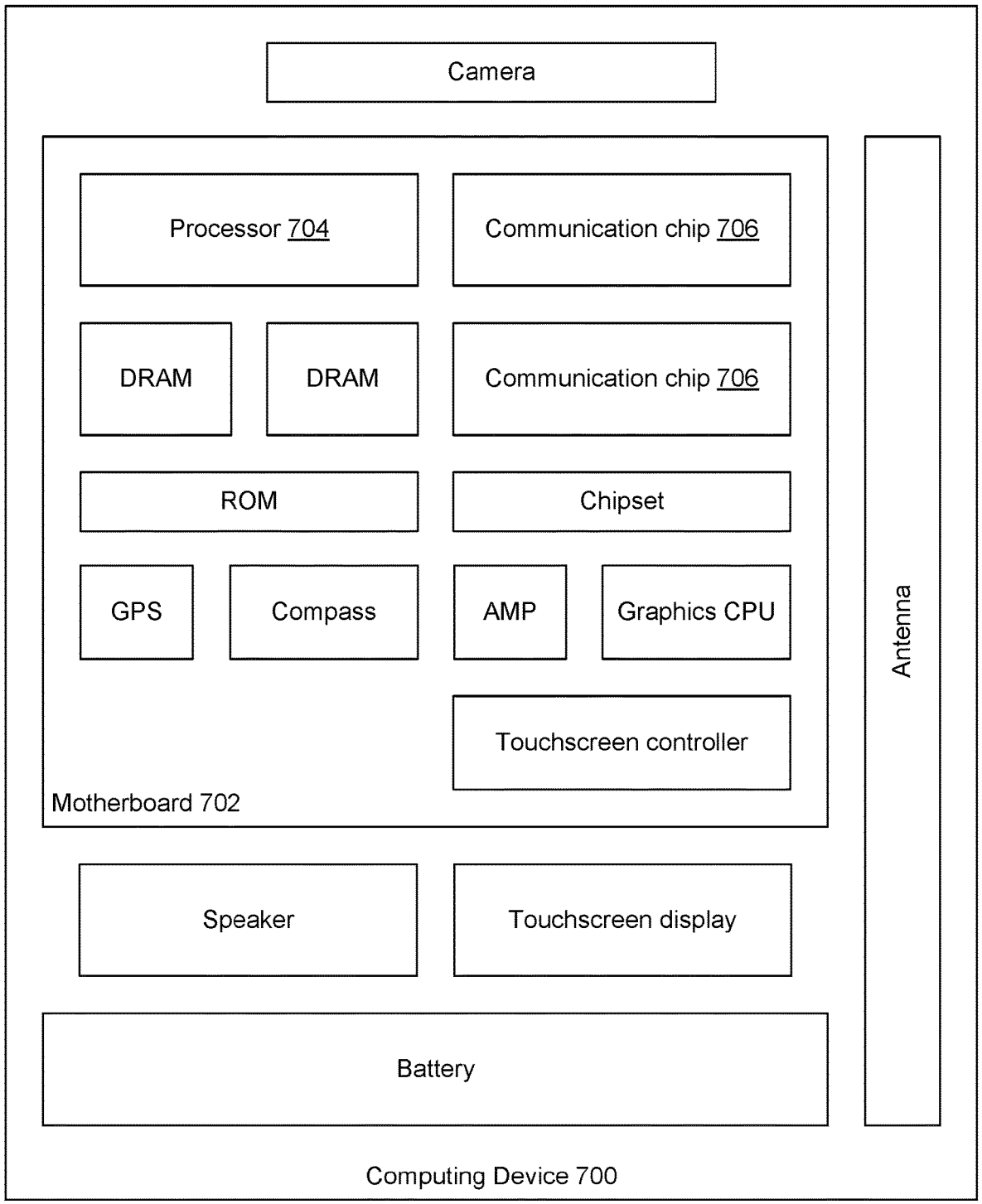
FIG. 7 illustrates a functional block diagram illustrating a computing device in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory. The communication chip 706 also includes an integrated circuit die packaged within the communication chip 706.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
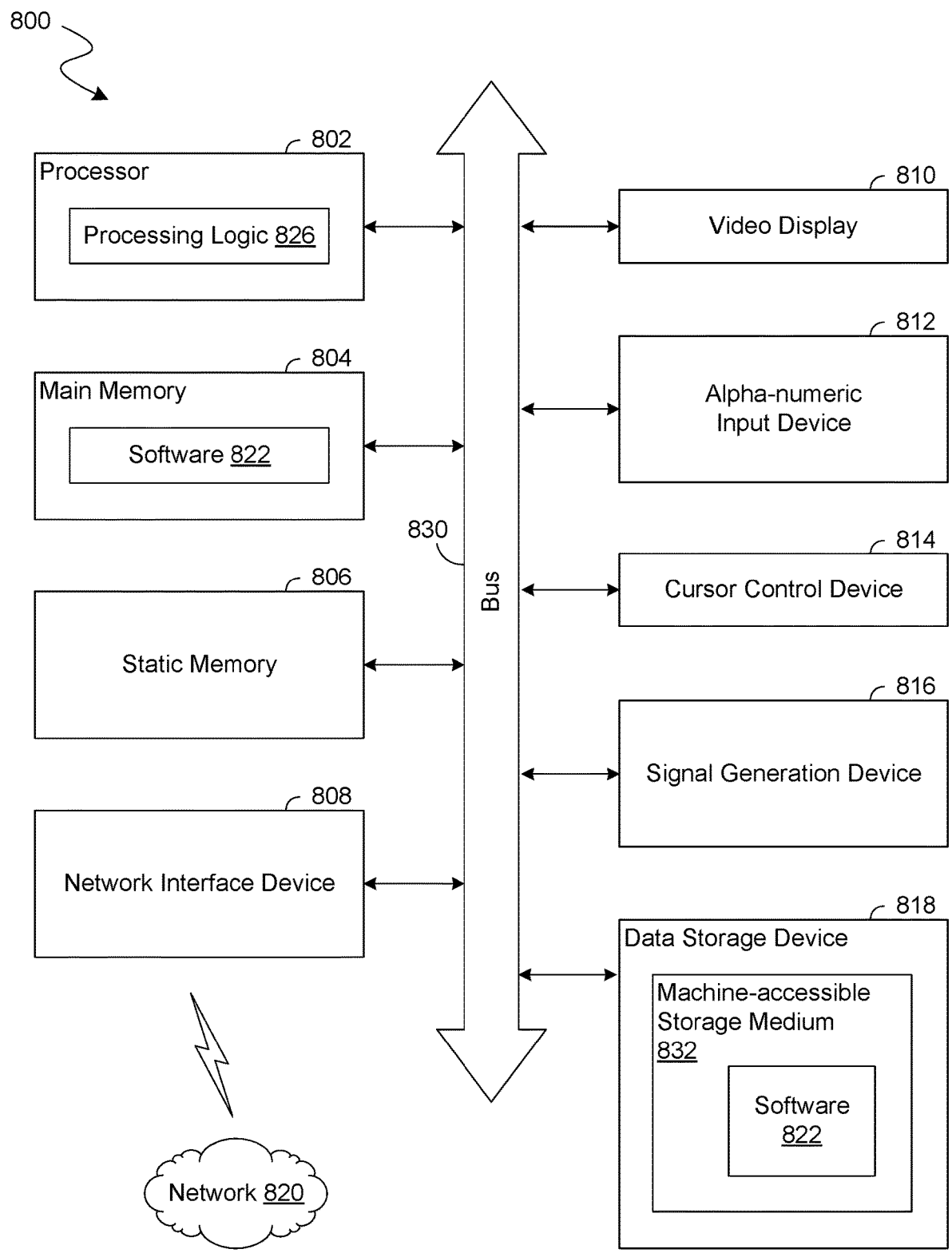
FIG. 8 is a functional block diagram illustrating an exemplary computer system, in accordance with one embodiment.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, a device assembly, comprises a substrate, an integrated circuit (IC) die over a surface of the substrate, and a heat spreader structure comprising a stack of material layers including a first material layer which extends over the IC die, and a second material layer in direct contact with the first material layer, wherein the first material layer and the second material layer have substantially a same composition.

In an embodiment, the first material layer and the second material layer each comprise predominantly copper or an alloy thereof, or predominantly aluminum or an alloy thereof. In another embodiment, one or more pores are formed in the heat spreader structure. In another embodiment, the one or more pores are each defined by at least a respective two material layers of the stack. In another embodiment, a first pore is defined at least in part by a first material of the heat spreader structure, and wherein a second material other than the first material is within the first pore. In another embodiment, the heat spreader structure comprises a first portion and a second portion, wherein, of the first portion and the second portion, only the second portion is over the IC die, wherein first pores, formed in the first portion, are at a first spacing from each other, and wherein second pores, formed in the second portion, are at a second spacing from each other, the second spacing larger than the first spacing, or for any pore formed in the heat spreader structure, the pore is outside of the second portion.

In another embodiment, the IC die is a first IC die, and the device assembly further comprises a second IC die over the surface of the substrate, wherein the first portion is over a region of the substrate between the first IC die and the second IC die. In another embodiment, for each pore of the one or more pores, a vertical height of the pore is equal to a height of a respective multiple material layers of the stack. In another embodiment, for each pore of the one or more pores, a shape of the pore is substantially oblong. In another embodiment, the IC die is a first IC die, and the device assembly further comprises a second IC die over the surface of the substrate, for each pore of the one or more pores, an orientation of the pore is substantially orthogonal to a line which includes a shortest distance between the first IC die and the second IC die. In another embodiment, the heat spreader structure is in direct contact with a semiconductor substrate of the IC die. In another embodiment, the device assembly further comprises one or more metallization layers between the IC die and the heat spreader structure, wherein the IC die and the heat spreader structure are each in direct contact with a respective one of the one or more metallization layers. In another embodiment, the IC die is a first IC die, wherein the device assembly further comprises a second IC die over the surface of the substrate, wherein the heat spreader structure comprises a first portion over the first IC die, and a second portion over the second IC die, and wherein a first total number of material layers of the first portion is different than a second total number of material layers of the second portion.

In another implementation, a device assembly comprises a substrate, an integrated circuit (IC) die over a surface of the substrate, and a heat spreader structure which extends over the IC die. The heat spreader structure comprises a stack of material layers including a first material layer which defines one of a top of a pore within the heat spreader structure, a bottom of the pore, or a sidewall structure of the pore, and a second material layer in direct contact with the first material layer, wherein the second material layer defines another of the top of the pore, the bottom of the pore, or the sidewall structure of the pore.

In an embodiment, the first material layer and the second material layer each comprise predominantly copper or an alloy thereof, or predominantly aluminum or an alloy thereof. In another embodiment, multiple pores are formed in the heat spreader structure, wherein the multiple pores are each defined by at least a respective two material layers of the stack. In another embodiment, the multiple pores are each defined at least in part by a first material of the heat spreader structure, and wherein a second material other than the first material is within the multiple pores. In another embodiment, the heat spreader structure comprises a first portion and a second portion, wherein, of the first portion and the second portion, only the second portion is over the IC die, wherein first pores, formed in the first portion, are at a first spacing from each other, and wherein second pores, formed in the second portion, are at a second spacing from each other, the second spacing larger than the first spacing, or for any pore formed in the heat spreader structure, the pore is outside of the second portion.

In another embodiment, the IC die is a first IC die, and the device assembly further comprises a second IC die over the surface of the substrate, wherein the first portion is over a region of the substrate between the first IC die and the second IC die. In another embodiment, for each pore of the multiple pores, a vertical height of the pore is equal to a height of a respective multiple material layers of the stack. In another embodiment, for each pore of the multiple pores, a shape of the pore is substantially oblong. In another embodiment, the IC die is a first IC die, and the device assembly further comprises a second IC die over the surface of the substrate, for each pore of the multiple pores, an orientation of the pore is substantially orthogonal to a line which includes a shortest distance between the first IC die and the second IC die. In another embodiment, the heat spreader structure is in direct contact with a semiconductor substrate of the IC die. In another embodiment, the device assembly further comprises one or more metallization layers between the IC die and the heat spreader structure, wherein the IC die and the heat spreader structure are each in direct contact with a respective one of the one or more metallization layers. In another embodiment, the IC die is a first IC die, wherein the device assembly further comprises a second IC die over the surface of the substrate, wherein the heat spreader structure comprises a first portion over the first IC die, and a second portion over the second IC die, and wherein a first total number of material layers of the first portion is different than a second total number of material layers of the second portion.

In another implementation, a system comprises a device assembly, comprising a substrate, a first integrated circuit (IC) die over a surface of the substrate, a second IC die over a surface of the substrate, and a heat spreader structure comprising a stack of material layers including a first material layer, and a second material layer in direct contact with the first material layer. The heat spreader structure comprises a first portion over the first IC die, and a second portion over the second IC die, wherein a first total number of material layers of the first portion is different than a second total number of material layers of the second portion. The system further comprises a power supply coupled to the device assembly to provide power to the first IC die.

In an embodiment, the first material layer and the second material layer each comprise predominantly copper or an alloy thereof, or predominantly aluminum or an alloy thereof. In another embodiment, multiple pores are formed in the heat spreader structure, wherein the multiple pores are each defined by at least a respective two material layers of the stack. In another embodiment, the multiple pores are each defined at least in part by a first material of the heat spreader structure, and wherein a second material other than the first material is within the multiple pores. In another embodiment, the heat spreader structure further comprises a third portion over a region between the first IC die and the second IC die, wherein first pores, formed in the third portion, are at a first spacing from each other, and wherein second pores, formed in the second portion, are at a second spacing from each other, the second spacing larger than the first spacing, or for any pore formed in the heat spreader structure, the pore is outside of the second portion.

In another embodiment, for each pore of the multiple pores, a vertical height of the pore is equal to a height of a respective multiple material layers of the stack. In another embodiment, for each pore of the multiple pores, a shape of the pore is substantially oblong. In another embodiment, for each pore of the multiple pores, an orientation of the pore is substantially orthogonal to a line which includes a shortest distance between the first IC die and the second IC die. In another embodiment, the heat spreader structure is in direct contact with a semiconductor substrate of the IC die. In another embodiment, the device assembly further comprises one or more metallization layers between the IC die and the heat spreader structure, wherein the IC die and the heat spreader structure are each in direct contact with a respective one of the one or more metallization layers.

In another implementation, a method for fabricating a packaged device comprises receiving an integrated circuit (IC) die coupled to a surface of a substrate, and successively printing layers of a heat spreader structure over a surface of the IC die, wherein the heat spreader structure and the substrate are on opposite respective sides of the IC die. In an embodiment, successively printing the layers comprises printing a first material layer and a second material layer in direct contact with the first material layer, wherein the first material layer and the second material layer have substantially a same composition. In another embodiment, successively printing the layers comprises forming one or more pores in the heat spreader structure.

In another embodiment, the one or more pores are each defined by at least a respective two material layers of the stack. In another embodiment, a first pore is defined at least in part by a first material of the heat spreader structure, and wherein a second material other than the first material is within the first pore. In another embodiment, the heat spreader structure comprises a first portion and a second portion, wherein, of the first portion and the second portion, only the second portion is over the IC die, wherein first pores, formed in the first portion, are at a first spacing from each other, and wherein second pores, formed in the second portion, are at a second spacing from each other, the second spacing larger than the first spacing, or for any pore formed in the heat spreader structure, the pore is outside of the second portion. In another embodiment, the IC die is a first IC die, wherein a second IC die is further coupled to the surface of the substrate, and wherein the first portion is over a region of the substrate between the first IC die and the second IC die.

In another embodiment, for each pore of the one or more pores, a vertical height of the pore is equal to a height of a respective multiple material layers of the stack. In another embodiment, for each pore of the one or more pores, a shape of the pore is substantially oblong. In another embodiment, the IC die is a first IC die, wherein a second IC die is further coupled to the surface of the substrate, and wherein, for each pore of the one or more pores, an orientation of the pore is substantially orthogonal to a line which includes a shortest distance between the first IC die and the second IC die. In another embodiment, the heat spreader structure is in direct contact with a semiconductor substrate of the IC die. In another embodiment, after successively printing the layers, one or more metallization layers are between the IC die and the heat spreader structure, wherein the IC die and the heat spreader structure are each in direct contact with a respective one of the one or more metallization layers. In another embodiment, the IC die is a first IC die, wherein a second IC die is further coupled to the surface of the substrate, and wherein the heat spreader structure comprises a first portion over the first IC die, and a second portion over the second IC die, and wherein a first total number of material layers of the first portion is different than a second total number of material layers of the second portion.

In another implementation, a method for fabricating a packaged device comprises receiving an integrated circuit (IC) die coupled to a surface of a substrate, and successively printing a stack of material layers of a heat spreader structure. The stack comprises a first material layer which defines one of a top of a pore within the heat spreader structure, a bottom of the pore, or a sidewall structure of the pore, and a second material layer in direct contact with the first material layer, wherein the second material layer defines another of the top of the pore, the bottom of the pore, or the sidewall structure of the pore. The method further comprises, after successively printing the layers, thermally coupling the heat spreader structure with the IC die, including moving the heat spreader structure into a position over the IC die.

In an embodiment, the first material layer and the second material layer each comprise predominantly copper or an alloy thereof, or predominantly aluminum or an alloy thereof. In another embodiment, multiple pores are formed in the heat spreader structure, wherein the multiple pores are each defined by at least a respective two material layers of the stack. In another embodiment, the multiple pores are each defined at least in part by a first material of the heat spreader structure, and wherein a second material other than the first material is within the multiple pores. In another embodiment, the heat spreader structure comprises a first portion and a second portion, wherein, of the first portion and the second portion, only the second portion is over the IC die, wherein first pores, formed in the first portion, are at a first spacing from each other, and wherein second pores, formed in the second portion, are at a second spacing from each other, the second spacing larger than the first spacing, or for any pore formed in the heat spreader structure, the pore is outside of the second portion. In another embodiment, the IC die is a first IC die, wherein a second IC die is further coupled to the surface of the substrate, and wherein the first portion is over a region of the substrate between the first IC die and the second IC die.

In another embodiment, for each pore of the multiple pores, a vertical height of the pore is equal to a height of a respective multiple material layers of the stack. In another embodiment, for each pore of the multiple pores, a shape of the pore is substantially oblong. In another embodiment, the IC die is a first IC die, wherein a second IC die is further coupled to the surface of the substrate, and wherein, for each pore of the multiple pores, an orientation of the pore is substantially orthogonal to a line which includes a shortest distance between the first IC die and the second IC die. In another embodiment, the heat spreader structure is in direct contact with a semiconductor substrate of the IC die. In another embodiment, after successively printing the layers, one or more metallization layers are between the IC die and the heat spreader structure, wherein the IC die and the heat spreader structure are each in direct contact with a respective one of the one or more metallization layers. In another embodiment, the IC die is a first IC die, wherein a second IC die is further coupled to the surface of the substrate, and wherein the heat spreader structure comprises a first portion over the first IC die, and a second portion over the second IC die, and wherein a first total number of material layers of the first portion is different than a second total number of material layers of the second portion.

Techniques and architectures for dissipating heat from circuitry are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device assembly, comprising:
   a substrate;
   an integrated circuit (IC) die over a surface of the substrate; and
   a heat spreader structure comprising a stack of material layers including:
     a first material layer which extends over the IC die; and
     a second material layer in direct contact with the first material layer, wherein the first material layer and the second material layer have substantially a same composition;
   wherein one or more pores are formed in the heat spreader structure.

2. The device assembly of claim 1, wherein the first material layer and the second material layer each comprise predominantly copper or an alloy thereof, or predominantly aluminum or an alloy thereof.

3. The device assembly of claim 1, wherein the one or more pores are each defined by at least the first material layer or the second material layer.

4. The device assembly of claim 1, wherein a first pore is defined at least in part by a first material of the heat spreader structure, and wherein a second material other than the first material is within the first pore.

5. The device assembly of claim 1, wherein the heat spreader structure comprises a first portion and a second portion;
wherein, of the first portion and the second portion, only the second portion is over the IC die;
wherein first pores, formed in the first portion, are at a first spacing from each other; and
wherein:
second pores, formed in the second portion, are at a second spacing from each other, the second spacing larger than the first spacing; or
for any pore formed in the heat spreader structure, the pore is outside of the second portion.

6. The device assembly of claim 1, wherein, for each pore of the one or more pores, a vertical height of the first material layer or the second material layer.

7. The device assembly of claim 1, wherein, for each pore of the one or more pores, a shape of the pore is substantially oblong.

8. The device assembly of claim 7, wherein the IC die is a first IC die, the device assembly further comprising:
a second IC die over the surface of the substrate, for each pore of the one or more pores, an orientation of the pore is substantially orthogonal to a line which includes a shortest distance between the first IC die and the second IC die.

9. The device assembly of claim 1, further comprising one or more metallization layers between the IC die and the heat spreader structure, wherein the IC die and the heat spreader structure are each in direct contact with a respective one of the one or more metallization layers.

10. The device assembly of claim 1, wherein the IC die is a first IC die;
wherein the device assembly further comprises a second IC die over the surface of the substrate;
wherein the heat spreader structure comprises:
a first portion over the first IC die; and
a second portion over the second IC die; and
wherein a first total number of material layers of the first portion is different than a second total number of material layers of the second portion.

11. A device assembly, comprising:
a substrate;
an integrated circuit (IC) die over a surface of the substrate; and
a heat spreader structure which extends over the IC die, the heat spreader structure comprising a stack of material layers including:
a first material layer which defines one of a top of a pore within the heat spreader structure, a bottom of the pore, or a sidewall structure of the pore; and
a second material layer in direct contact with the first material layer, wherein the second material layer defines another of the top of the pore, the bottom of the pore, or the sidewall structure of the pore.

12. The device assembly of claim 11, wherein multiple pores are formed in the heat spreader structure, wherein the multiple pores are each defined by at least the first material layer or the second material layer.

13. The device assembly of claim 12, wherein the heat spreader structure comprises a first portion and a second portion;
wherein, of the first portion and the second portion, only the second portion is over the IC die;
wherein first pores, formed in the first portion, are at a first spacing from each other; and
wherein:
second pores, formed in the second portion, are at a second spacing from each other, the second spacing larger than the first spacing; or
for any pore formed in the heat spreader structure, the pore is outside of the second portion.

14. The device assembly of claim 11, wherein the IC die is a first IC die;
wherein the device assembly further comprises a second IC die over the surface of the substrate;
wherein the heat spreader structure comprises:
a first portion over the first IC die; and
a second portion over the second IC die; and
wherein a first total number of material layers of the first portion is different than a second total number of material layers of the second portion.

15. A system, comprising:
a device assembly, comprising:
a substrate;
a first integrated circuit (IC) die over a surface of the substrate;
a second IC die over a surface of the substrate; and
a heat spreader structure comprising a stack of material layers including a first material layer, and a second material layer in direct contact with the first material layer, wherein the heat spreader structure comprises:
a first portion over the first IC die; and
a second portion over the second IC die, wherein a first total number of material layers of the first portion is different than a second total number of material layers of the second portion; and
a power supply coupled to the device assembly to provide power to the first IC die.

16. The system of claim 15, wherein multiple pores are formed in the heat spreader structure, wherein the multiple pores are each defined by at least the first material layer or the second material layer.

17. The system of claim 16, wherein the heat spreader structure further comprises a third portion over a region between the first IC die and the second IC die;
wherein first pores, formed in the third portion, are at a first spacing from each other; and
wherein:
second pores, formed in the second portion, are at a second spacing from each other, the second spacing larger than the first spacing; or
for any pore formed in the heat spreader structure, the pore is outside of the second portion.

18. The system of claim 16, wherein, for each pore of the multiple pores, a shape of the pore is substantially oblong.

19. The system of claim 18, wherein, for each pore of the multiple pores, an orientation of the pore is substantially orthogonal to a line which includes a shortest distance between the first IC die and the second IC die.

* * * * *